United States Patent
Delano

(10) Patent No.: US 6,693,491 B1
(45) Date of Patent: *Feb. 17, 2004

(54) METHOD AND APPARATUS FOR CONTROLLING AN AUDIO SIGNAL LEVEL

(75) Inventor: Cary L. Delano, Los Altos, CA (US)

(73) Assignee: Tripath Technology, Inc., San Jose, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 09/836,154

(22) Filed: Apr. 16, 2001

Related U.S. Application Data

(60) Provisional application No. 60/197,468, filed on Apr. 17, 2000.

(51) Int. Cl.⁷ .................................................. H03G 3/12
(52) U.S. Cl. ........................ 330/282; 330/86; 330/254; 330/284; 341/154
(58) Field of Search ........................ 330/86, 254, 282, 330/284; 341/154

(56) References Cited

U.S. PATENT DOCUMENTS

| | | | | |
|---|---|---|---|---|
| 4,843,394 A | * | 6/1989 | Linz et al. ................ | 341/154 |
| 5,233,309 A | * | 8/1993 | Spitalny .................... | 330/84 |
| 5,523,712 A | * | 6/1996 | Miyabe et al. ............ | 330/254 |
| 6,127,893 A | * | 10/2000 | Llewellyn et al. ......... | 330/284 |

OTHER PUBLICATIONS

Su, David K. and Wooley, Bruce A., *A CMOS Oversampling D/A Converter with a Current–Mode Semidigital Reconstruction Filter*, Dec. 1993, IEEE Journal of Solid–State Circuits, vol. 28, No. 12.

* cited by examiner

*Primary Examiner*—Michael B Shingleton
(74) *Attorney, Agent, or Firm*—Beyer Weaver & Thomas, LLP.

(57) ABSTRACT

A control circuit for controlling a level of an audio signal and transmitting the signal to an amplifier is described. The control circuit is based on an R-2R resistor network having a first plurality of resistor nodes and a parallel resistor network having a second plurality of resistor nodes. Each of the resistors in the parallel network has a value equal to one-half of the value of the preceding resistor. A plurality of switches alternately connects each of the plurality of resistor nodes to one of a plurality of low impedance nodes and a low impedance input node associated with the amplifier. Switch control circuitry selectively controls the plurality of switches to transmit the audio signal to the low impedance input node.

18 Claims, 4 Drawing Sheets

METHOD AND APPARATUS FOR CONTROLLING AN AUDIO SIGNAL LEVEL

CROSS REFERENCE TO RELATED APPLICATIONS

This application claims priority of provisional U.S. patent application Serial No. 60/197,468 filed Apr. 17, 2000, titled "METHOD AND APPARATUS FOR CONTROLLING AN AUDIO SIGNAL LEVEL" which is incorporated in its entirety for all purposes by reference.

BACKGROUND OF THE INVENTION

1. Field of the Invention

The present invention relates to techniques for controlling the level of a signal. More specifically, the present invention provides methods and apparatus for controlling the level of a signal of amplifiers.

2. Description of the Prior Art

Virtually all audio amplification systems require a means of controlling the overall gain of the signal path. Such systems are described in described in U.S. Pat. No. 5,777,512 for METHOD AND APPARATUS FOR OVERSAMPLED, NOISE-SHAPING, MIXED-SIGNAL PROCESSING issued on Jul. 7, 1998, the entire disclosure of which is incorporated herein by reference for all purposes as well as in U.S. patent application Ser. No. 09/156,262 for METHOD AND APPARATUS FOR CONTROLLING AN AUDIO SIGNAL INPUT LEVEL filed on Sep. 18, 1998, the entire disclosure of which is incorporated herein by reference for all purposes.

Such gain control enables the system engineer to optimize signal levels to fit the dynamic range of the system and allows end-users to adjust the loudness or volume of the amplified sound to suit comfort levels or taste. Volume control can be achieved by means including variable resistive elements, e.g., potentiometers, in the analog audio path, variable gain amplifiers (VGAs) in the analog audio path, and multiplication of digitized audio by a digital volume control word.

In multi-channel systems such as 2-channel conventional stereo or 4–6 channel surround audio systems, potentiometers ("pots") are often ganged on a common rotational shaft such that all channels receive roughly the same degree of gain control. Alternatively, multiple VGAs can be used for a plurality of channels, each receiving the same gain control signal as all others, in order to achieve a uniform overall gain setting. In the digital domain, each audio channel receives the appropriate digital gain parameter value.

In the case where individual channel gains need to have a relative offset but still track together globally, such as in left/right balance (pan) or interchannel trimming, additional potentiometers can be added to the pot-based system in series with the master volume control or a slip clutch mechanism can be used to allow individual pot adjustability in the ganged pot configuration. Also, per-channel offsets can be added to the global gain control signal in VGA-based systems, and numerical offsets can be similarly implemented between the channel gain parameters in the digital system.

Audio volume control circuits must typically satisfy a broad range of requirements. For example, such circuits should have a logarithmic transfer function to match the nature of human loudness perception. A logarithmic transfer function is achieved in pot-based systems by the use of "audio taper" pots which have a logarithmic variation in their resistance as a function of shaft rotation. This works well in most applications, with the disadvantage that it can be difficult to inexpensively manufacture pots which can precisely match one another for ganged use. As a result, in modestly priced audio systems differences between channel volumes at low volume settings are often easily perceived. In VGA-based systems, the logarithmic volume variation is implemented by mapping of the control signal from linear input (e.g., a voltage from a potentiometer or DAC) into the appropriate logarithmic form. Alternatively, the control voltage can be derived from an audio taper pot. In digital volume control systems, the logarithmic volume steps can be achieved with a mapping function, e.g., from a simple look-up table.

Audio volume control circuits must also exhibit low noise. Potentiometers, since they are passive devices, contribute no active noise to the signal path, but can degrade audio signals with resistor thermal noise, and discontinuity noise from, for example, a dirty wiper contact. In some cases pots also allow electromagnetic interference to enter the audio path due to inadequate shielding. VGAs are active devices akin to operational amplifiers and therefore inherently contribute some degree of noise. This noise can be minimized with adequate design techniques, but this comes at additional cost due to larger signal handling transistors or increased bias current in gain stages. In digital volume control systems, if implemented exclusively in the digital domain, the system noise is governed by the bit resolution of the system following the volume control block. For example, if one has a 16-bit digital audio system with digital-only volume control, this implies that full output loudness correlates to activity in all 16 bits at the DAC that drives the power amplifier. If one then sets the volume to be ¼ of the maximum available dynamic range, i.e., a volume reduction of 2 bits, one is left only using 14 bits at the DAC—a distinct cut in resolution. Also, noise and distortion products contributed by the DAC and any subsequent EQ are not attenuated when volume is reduced. The noise floor can thus become apparent at even normal volume settings. It is for this reason that all-digital volume controls are usually not used, and instead a hybrid of pre-DAC digital control and post-DAC analog control is used if the system is to include any volume control in the digital domain.

Audio volume control circuits must also exhibit low distortion. Passive, potentiometer-based volume control systems are essentially distortionless. The exception to this might be very slight voltage-based resistor value dependencies. VGAs are active amplification devices and are therefore subject to the usual set of non-ideal characteristics inherent in any active gain block that can contribute to overall distortion. All-digital volume controls could potentially suffer from distortion due to truncation or rounding errors in the multiplication process.

Audio volume control circuits must also exhibit transition smoothness. Changes from one gain setting to another should be done on a gradual scale to prevent the introduction of audible artifacts into the audio. After all, gain control is actually the multiplication of the hi fidelity audio signal(s) with a quasi-static control signal, and any aberrant behavior in the control signal will produce modulation products in the audio signal. The "trick" is to keep all variations in the gain control signal sufficiently gradual, e.g., with frequency components below 10 Hz, and/or small in amplitude, such that the modulation products remain unnoticeable or unobtrusive. Hand-operated potentiometers inherently provide a relatively slow and smooth transition from one gain setting to the next by virtue of the limited rate at which the human operator can turn the control knob. If, however, the potentiometer(s) is (are) operated by a stepper motor (as in the case of remote control) there is more risk that the individual stair steps of volume change will be noticeable, depending on the servo-stepper design. In VGA systems, the gain control signal must be made to ramp smoothly between gain settings even if the command to change is a step function. This is easily achieved if the signal is derived from a continuous source such as a pot, but requires more care if the control signal is derived from a more coarse source such as a DAC. In digital volume control systems, smaller, intermediate gain steps can be added between allowed volume setting increments, permitting the control algorithm to more closely approximate a smooth ramp during volume changes. For example, if the volume control is only allowed to sit on integer dB positions such as 0 dB, −1 dB, −2 dB, and so forth, it could be made to micro-step between these steps in ¼ dB increments to reduce the audibility of the 1 dB steps.

Audio volume control circuits must also enable precise tracking between channels in multi-channel systems. That is, where two or more channels are involved, it is usually desirable that the volume control function for each channel closely match that of the others throughout its entire gain control range. Offsets can be intentionally introduced between channel gains for purposes of left/right balance or front/rear inter-channel trimming, but once these offsets are determined it is again necessary for all channels to faithfully track the master gain control signal in proper proportion. In potentiometer-based systems, as mentioned, pots are often physically ganged onto a single, rotating shaft to achieve tracking.

Left/right balance or inter-channel trimming can be achieved either by the use of concentric shafts controlling the individual pots with a slip-clutch mechanism to achieve a ganging function with relative adjustability, or by the use of additional pots in series with each channel for balance/trimming. The former method has the disadvantage of mechanical complexity and does not function well at very low or very high volume settings because one offset channel will hit the extreme stop point before the other(s). The latter method has the disadvantage of requiring more pots. In a VGA system, it becomes necessary to use VGAs that have closely matched gain control functions. In the digital domain, precise tracking is easily implemented given the exacting nature of the digital calculations involved.

Audio volume control circuits must also exhibit a wide dynamic range. A typical operating range for a volume control system is 80–100 dB gain variation. Ideally, a volume control system would be able to pass all 96 dB of the dynamic range contained in a commercial CD recording even when at its minimum gain setting, implying a signal path dynamic range of nearly 196 dB. Of course at minimum gain setting (before muting altogether) the volume is so low that much or most the 96 dB of the CD recording is lost to human hearing, so the 196 dB figure is unnecessary in practical terms. Nonetheless, it will be understood that the dynamic range required of a good volume control circuit is well in excess of the audio program material which it passes. For potentiometer-based volume controls this is generally not a problem, since the passive nature of the resistor usually adds little noise (if low in resistive value and appropriate material is used) and virtually no distortion. Low distortion is more of a challenge for the VGA system because of the active nature of the gain-controlling amplifier circuitry. The VGA will add some limited degree of distortion that usually increases with lower gain settings. As discussed above, it will also add some degree of noise. In an all-digital volume control system the output of the volume control block would have to be of significantly more bits than 16 to achieve the type of dynamic range which is desirable. For example, if the volume control word is 8-bits and the audio 16-bits, the resulting gain-controlled output would be 24-bits. This 24-bit word would have to pass through an equivalent 24-bit DAC before being fed to the power amplifier. And, as will be understood, a DAC of that resolution is prohibitively expensive. Some would even debate whether true 24-bit DACs are actually realizable with today's technology.

Digital control is also desirable for audio volume control circuits. With the advent of digitally operated audio equipment such as remote-controlled home stereo receivers, televisions, and other home entertainment systems, the need arose for the digitally operated volume control. Here, a relatively low resolution binary control word of perhaps 6 to 8 bits (i.e., 64 to 256 levels) is used to select gain levels over the operating range of the volume control in a logarithmic scale. This can be applied in potentiometer-based volume control systems with the use of a remotely operated stepper motor actuating the rotary shaft of the pot(s). The added cost and undesirable complexity of such a setup is relatively easy to imagine. In VGA-based systems, a DAC can be used to receive control commands from some remote source and convert them into gain control signal(s) as appropriate. In all-digital systems, the volume control word (appropriately mapped into logarithmic form) is simply multiplied by the audio signal to produce a volume-controlled result.

Reliability is, of course, a desirable characteristic of volume control circuits. A potentiometer is an electromechanical item that is subject to the deleterious effects of heat, moisture, dust, corrosion, vibration, and simple wear and tear. In many consumer electronic devices, it is among the first subsystems of the product which develop problems, usually due to dirt or dust contamination. In addition, if a motor of some sort is used to actuate the potentiometer digitally or remotely, the electromechanical complexity increases and reliability correlatively decreases. VGAs and digital volume control implementations are built mostly or completely from discrete or integrated semiconductors with perhaps some passive components, and exhibit the high degree of reliability associated with such components.

It is also desirable that audio volume control circuits are both easy to implement and easy to use. A potentiometer or even a gang of two or more is very easily incorporated into an audio system as well as easily operated. This is less true if a stepper motor actuator is employed for digital or remote control. A VGA system is relatively easily designed by an experienced circuit designer, but can be somewhat complex. Digital implementation is fairly straightforward to an experienced digital ASIC designer but adds complexity to the DAC design.

System simplification and cost reduction by means of circuit integration is also essential in most audio marketplace sectors. A single, ganged, or servo-driven potentiometer simply cannot be integrated into an IC. The VGA approach can be integrated, but makes for a fairly complex analog IC function if high performance is targeted. The digital approach, of course, integrates naturally.

Finally, low cost is desirable for audio volume control circuits. Single or double-gang potentiometers are inexpensive. Concentric slip-clutch potentiometers are more costly, and pot combinations that are sealed against dust and have good inter-pot tracking are even more expensive. When a servo operation mechanism is added, the cost goes up dramatically. VGAs are not particularly expensive, but are more costly than op amps of similar performance ratings simply because they are sold in lower quantities. A digital volume control implementation has only a small incremental cost associated with it because it comprises only a modest number of gates with respect to the usual complexity of a digital audio ASIC of which it would be a part.

It is clear from the above discussion that each of the currently available techniques for implementing volume control in audio systems has its disadvantages with regard to at least some of the desirable characteristics of volume control circuitry.

It is therefore desirable to provide volume control technology that exhibits all of these characteristics as well or better than the technologies discussed above.

SUMMARY OF THE INVENTION

According to the present invention, a level control circuit is provided which satisfies all of the requirements described above at least as well or better than any of the above-described technologies. The present invention takes advantage of the logarithmic characteristic of what is known as an R-2R resistor network topology to precisely attenuate an incoming analog audio signal in 6 dB steps for any number of channels. In addition, the present invention incorporates a parallel resistor network coupled to the incoming analog audio signal to provide additional bits of resolution to the 6 dB steps described above. The 2R resistors are selectively switched between ground and the virtual ground represented by the input of an operational amplifier following the R-2R network. Because the operation of the network is essentially independent of the base resistor value of the network, R may be kept low thereby minimizing the contribution to system noise due to resistor thermal noise. Moreover, because the switches which selectively couple the R-2R network to the operational amplifier (and which therefore pass the audio signal) experience no voltage variations at their terminals, distortion due to such variations is virtually eliminated. According to one embodiment, a variable gain amplifier is included in series with the R-2R network and the parallel resistor network to provide intermediate gain selections between the 6 dB steps in increments of 0.5 dB. According to another embodiment, two R-2R networks and two parallel resistor networks are interposed between differential operational amplifiers. The level control circuit of the present invention may be employed, for example, to control the output level of an audio component such as an audio amplifier.

Thus, the present invention provides a circuit comprising an R-2R resistor ladder having a first plurality of resistor nodes and a parallel resistor network having a second plurality of resistor nodes. A plurality of switches are coupled to the first and second pluralities of resistor nodes for connecting each of the plurality of resistor nodes to one of a plurality of low impedance nodes.

A further understanding of the nature and advantages of the present invention may be realized by reference to the remaining portions of the specification and the drawings.

BRIEF DESCRIPTION OF THE DRAWINGS

The invention may best be understood by reference to the following description taken in conjunction with the accompanying drawings in which.

DESCRIPTION OF SPECIFIC EMBODIMENTS

Figure 1:
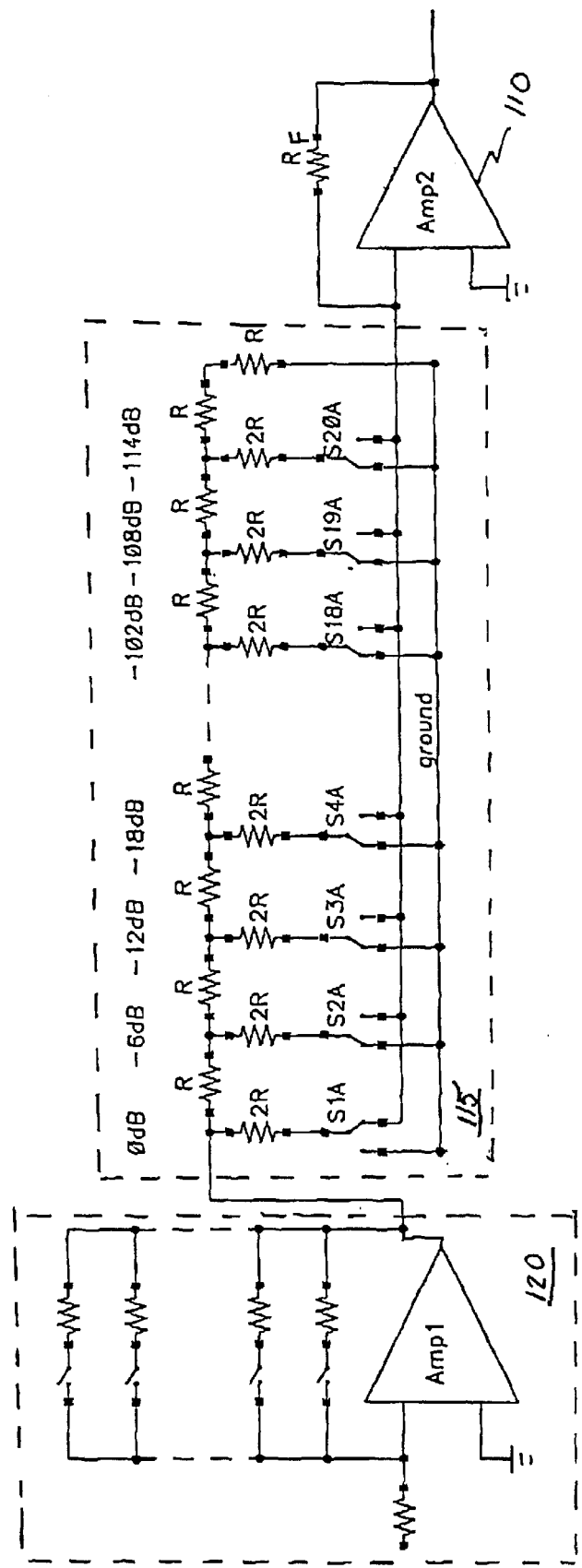
FIG. 1 is a schematic diagram of a digital-to-analog converter (DAC) based on an R-2R network topology.

Methods and apparatus for controlling a signal level are described in U.S. patent application Ser. No. 09/156,262 for METHOD AND APPARATUS FOR CONTROLLING AN AUDIO SIGNAL INPUT LEVEL filed on Sep. 18, 1998, the entire disclosure of which is incorporated herein by reference for all purposes. In a specific embodiment described in that application, the invention provides a volume control circuit with a large dynamic range, cheaply implemented, with low noise based on an R-2R network. FIG. 1 shows an example of such an implementation.

The circuit of FIG. 1 takes advantage of the logarithmic characteristic of the R-2R resistor network topology to precisely attenuate an incoming analog audio signal in 6 dB steps for any number of channels. The 2R resistors are selectively switched between ground and the virtual ground represented by the input of an operational amplifier 110 following the R-2R network 115. Because the operation of the network is essentially independent of the base resistor value of the network, R may be kept low thereby minimizing the contribution to system noise due to resistor thermal noise. Moreover, because the switches (S1A–S20A) which selectively couple the R-2R network 115 to the operational amplifier 110 (and which therefore pass the audio signal) experience no voltage variations at their terminals, distortion due to such variations is virtually eliminated. According to the implementation shown in FIG. 1, a 0–5.5 dB DAC 120 is included in series with the R-2R network 115 to provide intermediate gain selections between the 6 dB steps in increments of 0.5 dB. The level control circuit of the present invention may be employed, for example, to control the output level of an audio component such as an audio amplifier.

At a low volume setting, e.g., the last switch S20A in the R-2R ladder is closed, the noise gain of operational amplifier 110 is approximately (1+Rf/Rin). The Rin represented by the R-2R ladder (with one switch closed and all of the other switches grounded) is always 3R, except at the highest volume settings. Thus, to reduce the noise gain of operational amplifier 110, it is desirable to make the resistors of the R-2R network larger. However, because the maximum gain of the amplifier is Rf/2R when S1A is closed, increasing the size of R undesirably reduces the maximum gain.

Figure 2:
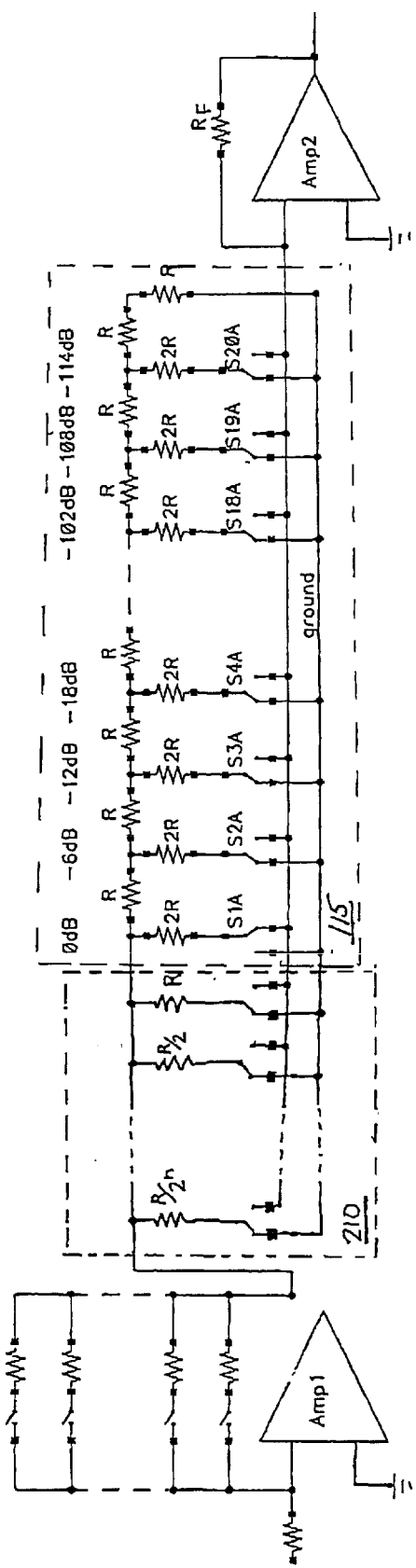
FIG. 2 is a schematic diagram of a level control circuit designed according to a specific embodiment of the invention.

Thus, according to a specific embodiment of the present invention as shown in FIG. 2, n additional bits (e.g., 6–8 bits or more) of resolution are added to the 6 dB steps of the R-2R network by adding n additional binary stepping "legs" in a parallel resistor network 210 preceding the R-2R network using resistors valued at R, R/2 . . . R/2$^n$, etc. The number n depends upon the number of additional bits of resolution desired. For best results, these additional resistors should be well matched in that they are not guaranteed to be monotonic like the 6 dB steps of the R-2R ladder. The matching required depends upon the number of bits added and the required linearity.

The configuration of FIG. 2 allows the size of the resistors of the R-2R network to be increased (thereby reducing the noise gain of the first integrator stage) without correlatively limiting the maximum gain of the amplifier because at high signal levels, the gain will be dependent upon the particular leg of the additional bits being employed, e.g., inversely proportional to $R/2^n$ rather than 2R.

Figure 3:
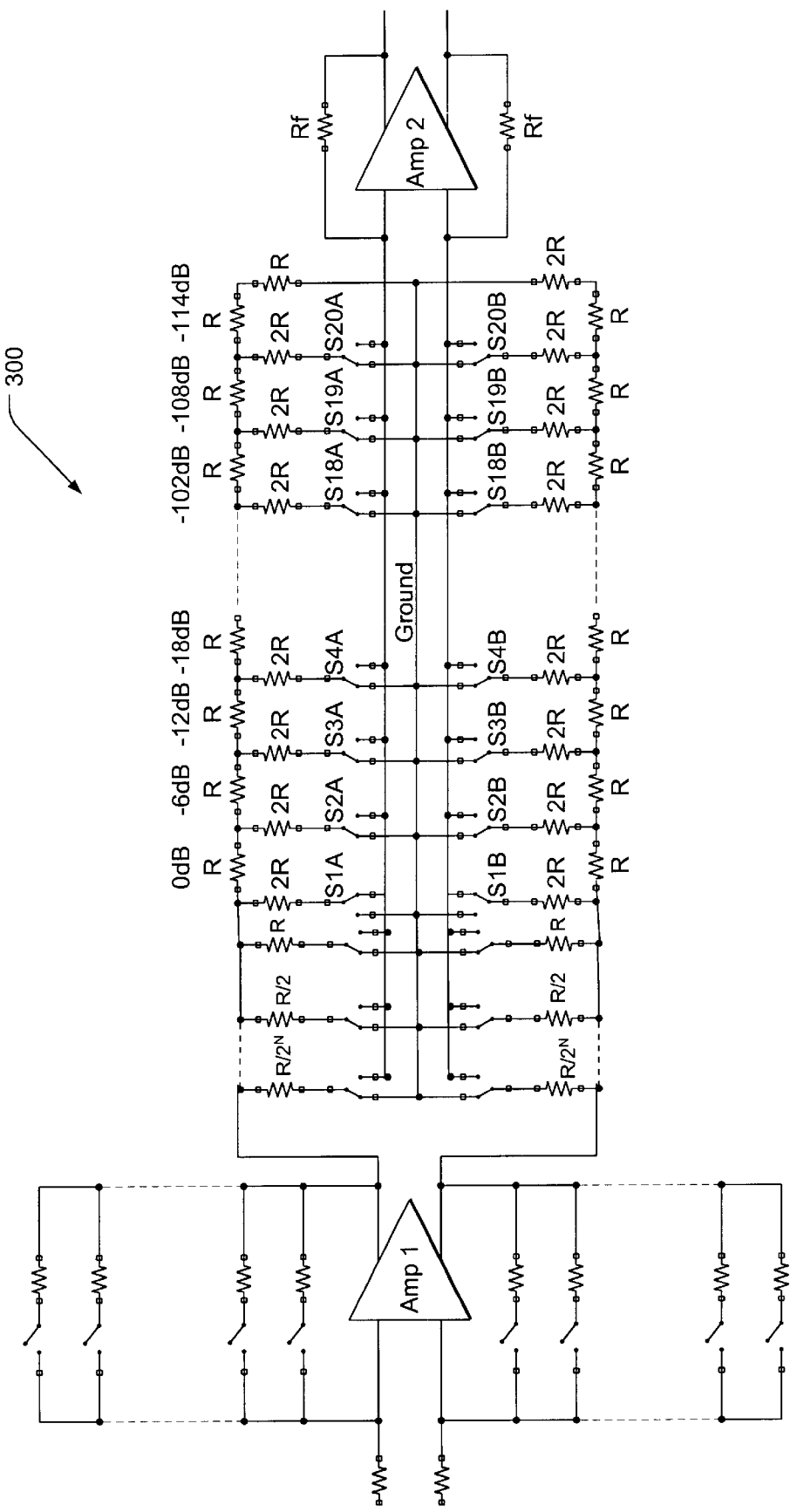
FIG. 3 is a schematic diagram of a level control circuit designed according to another specific embodiment of the invention.
Figure 4:
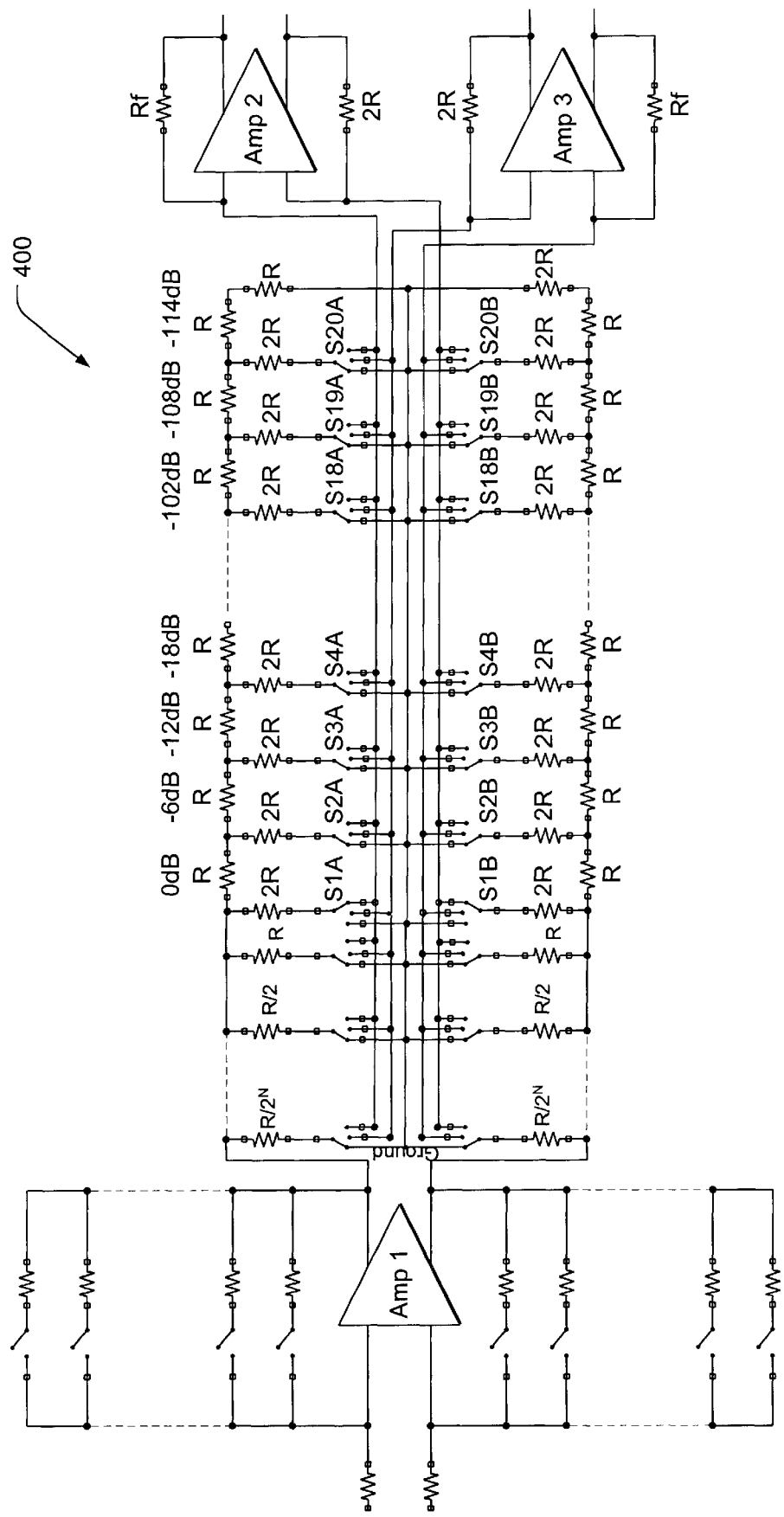
FIG. 4 is a schematic diagram of a level control circuit designed according to another specific embodiment of the invention.

FIG. 3 shows a level control circuit 300 designed according to a specific embodiment of the invention which includes an R-2R resistor ladder and parallel resistor network interposed between two differential operational amplifiers Amp1 and Amp2. The number of independent outputs from the R-2R ladder is also extensible, as shown in the level control circuit of FIG. 4.

While the invention has been particularly shown and described with reference to specific embodiments thereof, it will be understood by those skilled in the art that changes in the form and details of the disclosed embodiments may be made without departing from the spirit or scope of the invention.

What is claimed is:

1. A control circuit for controlling a level of a signal and transmitting the signal to a first amplifier, comprising:

a first R-2R resistor network for receiving the signal, the first R-2R resistor network having a first plurality of resistor nodes;

a first parallel resistor network for receiving the signal, having a plurality of parallel resistors with different values and a second plurality of resistor nodes, the first of the plurality of parallel resistors having a value R corresponding to the value of R in the first R-2R resistor network, and each subsequent resistor in the plurality having a value of one-half times the value of the preceding resistor;

a first plurality of switches coupled to the first plurality of resistor nodes for alternately connecting each of the first plurality of resistor nodes to one of a plurality of low impedance nodes and a first low impedance input node associated with the first amplifier;

a second plurality of switches coupled to the second plurality of resistor nodes for alternately connecting each of the second plurality of resistor nodes to one of a plurality of low impedance nodes and a first low impedance input node associated with the first amplifier; and switch control circuitry for selectively controlling the first plurality of switches and the second plurality of switches to transmit the signal to the first low impedance input node, wherein the switch control circuitry is configured to connect only one of the first and second pluralities of resistor nodes to the first low impedance input node at a time.

2. The control circuit of claim 1 wherein the number of resistors in the first parallel resistor network corresponds to the number of additional bits of resolution desired.

3. The control circuit of claim 1 further comprising a variable gain amplifier coupled to the first R-2R resistor network and the first parallel resistor network, the variable gain amplifier providing for greater resolution control of the level of the signal as compared to the first R-2R resistor network alone.

4. The control circuit of claim 3 wherein the first R-2R resistor network controls the level of the signal in approximately 6 dB increments, the variable gain amplifier controlling the level of the signal in approximately 0.5 dB increments within each 6 dB increment.

5. The control circuit of claim 1 wherein the plurality of low impedance nodes are coupled to ground.

6. The control circuit of claim 1 wherein first ones of the plurality of low impedance nodes are coupled to ground and second ones of the plurality of low impedance nodes are coupled to a second low impedance input node associated with a second amplifier.

7. The control circuit of claim 1 wherein the first amplifier is a differential amplifier having a second low impedance input node associated therewith and the signal is a differential signal, the control circuit further comprising:

a second R-2R resistor network for receiving a portion of the differential signal, the second R-2R resistor network having a third plurality of resistor nodes; and a second parallel resistor network for receiving a portion of the differential signal and having a fourth plurality of resistor nodes;

a third plurality of switches coupled to the third plurality of resistor nodes for alternately connecting each of the third plurality of resistor nodes to one of the plurality of low impedance nodes and the second low impedance input node; and a fourth plurality of switches coupled to the fourth plurality of resistor nodes for alternately connecting each of the fourth plurality of resistor nodes to one of the plurality of low impedance nodes and the second low impedance input node; wherein the switch control circuitry selectively controls the third and fourth pluralities of switches to transmit the portion of the differential signal to the second low impedance input node.

8. The control circuit of claim 1 wherein the first amplifier is configured for unity gain when the switch control circuitry configures the first and second pluralities of switches to transmit the signal to the first low impedance input node.

9. The control circuit of claim 1 wherein the first R-2R resistor network has an input impedance associated therewith, the input impedance remaining constant regardless of which of the first plurality of resistor nodes is connected to the first low impedance input node.

10. A method for attenuating a level of an analog signal and transmitting the signal to an amplifier, comprising:

introducing the analog signal to a control circuit comprising an R-2R resistor network having a first plurality of resistor nodes and a parallel resistor network having a plurality of parallel resistors with different values and a second plurality of resistor nodes, the first of the plurality of parallel resistors having a value R corresponding to the value of R in the R-2R network, and each subsequent resistor in the plurality having a value of one-half times the value of the preceding resistor, the control circuit also having a plurality of switches coupled to the pluralities of resistor nodes for alternately connecting each of the plurality of resistor nodes to one of a plurality of low impedance nodes and a low impedance input node associated with the amplifier; and selectively controlling the plurality of switches to connect only one of the first and second pluralities of resistor nodes to the low impedance input node at a time, thereby attenuating the level of the analog signal and transmitting the analog signal to the amplifier.

11. An audio component comprising a volume control circuit for controlling a level of an audio signal and transmitting the signal to an amplifier, the volume control circuit comprising:

an R-2R resistor network for receiving the audio signal, the R-2R resistor network having a first plurality of resistor nodes;

a parallel resistor network for receiving the signal, having a plurality of parallel resistors with different values and a second plurality of resistor nodes, the first of the plurality of parallel resistors having a value R corresponding to the value of R in the R-2R network, and each subsequent resistor in the plurality having a value of one-half times the value of the preceding resistor;

a plurality of switches coupled to the first and second pluralities of resistor nodes for alternately connecting each of the plurality of resistor nodes to one of a plurality of low impedance nodes and a low impedance input node associated with the amplifier; and switch control circuitry for selectively controlling the plurality of switches to transmit the audio signal to the low impedance input node, wherein the switch control circuitry is configured to connect only one of the first and second pluralities of resistor nodes to the first low impedance input node at a time.

12. An integrated circuit for controlling a level of a differential audio signal, comprising:

a first differential amplifier for receiving the differential audio signal, the first differential amplifier having first and second differential output terminals;

a first R-2R resistor network coupled to the first differential output terminal, the first R-2R resistor network having a first plurality of resistor nodes;

a first plurality of switches coupled to the first plurality of resistor nodes for alternately connecting each of the first plurality of resistor nodes to one of a plurality of low impedance nodes and a first low impedance input node;

a first parallel resistor network coupled to the first differential output terminal, having a plurality of parallel resistors with different values and a second plurality of resistor nodes, the first of the plurality of parallel resistors having a value R corresponding to the value of R in the first R-2R network, and each subsequent resistor in the plurality having a value of one-half times the value of the preceding resistor;

a second plurality of switches coupled to the second plurality of resistor nodes for alternately connecting each of the second plurality of resistor nodes to one of a plurality of low impedance nodes and the first low impedance input node a second R-2R resistor network coupled to the second differential output terminal, the second R-2R resistor network having a third plurality of resistor nodes;

a third plurality of switches coupled to the third plurality of resistor nodes for alternately connecting each of the third plurality of resistor nodes to one of the plurality of low impedance nodes and a second low impedance input node;

a second parallel resistor network coupled to the second differential output terminal, having a plurality of parallel resistors with different values and a fourth plurality of resistor nodes, the first of the plurality of parallel resistors having a value R corresponding to the value of R in the second R-2R network, and each subsequent resistor in the plurality having a value of one-half times the value of the preceding resistor;

a fourth plurality of switches coupled to the fourth plurality of resistor nodes for alternately connecting each of the fourth plurality of resistor nodes to one of a plurality of low impedance nodes and the second low impedance input node;

switch control circuitry for selectively controlling the first, second, third and fourth pluralities of switches; and a second differential amplifier having first and second differential input terminals coupled to the first and second low impedance input nodes.

13. The integrated circuit of claim 12 wherein the first differential amplifier is configured as a variable gain amplifier.

14. The integrated circuit of claim 12 wherein the second differential amplifier is configured as a variable gain amplifier.

15. The integrated circuit of claim 12 wherein the first and second differential amplifiers, first and second R-2R resistor networks, first and second parallel resistor networks, first, second, third and fourth pluralities of switches, and the switch control circuitry are formed using a CMOS fabrication process.

16. The control circuit as recited in claim 1, wherein the switch control circuitry is configured to connect only one of the first and second pluralities of resistor nodes to the first low impedance input node at a time.

17. The audio component as recited in claim 11 wherein the switch control circuitry is configured to selectively control the plurality of switches so that only one of the first and second pluralities of resistor nodes is connected to the first low impedance input node at a time.

18. The method for attenuating a level of an analog signal and transmitting the signal to an amplifier as recited in claim 10 wherein the plurality of switches is selectively controlled so that only one of the first and second pluralites of resistor nodes is connected to the first low impedance input node at a time.

* * * * *